United States Patent
Hsiao et al.

(10) Patent No.: US 8,183,617 B2
(45) Date of Patent: May 22, 2012

(54) INJECTION METHOD WITH SCHOTTKY SOURCE/DRAIN

(75) Inventors: Yi-Hsuan Hsiao, Budai Township, Chiavi County (TW); Erh-Kun Lai, Longling Shiang (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 407 days.

(21) Appl. No.: 12/430,817

(22) Filed: Apr. 27, 2009

(65) Prior Publication Data

US 2010/0271878 A1 Oct. 28, 2010

(51) Int. Cl.
*H01L 29/76* (2006.01)
(52) U.S. Cl. .............. 257/314; 257/315; 257/316
(58) Field of Classification Search ........... 257/314–316
See application file for complete search history.

(56) References Cited

U.S. PATENT DOCUMENTS 7,071,102 B2 7/2006 Huang
2009/0039357 A1* 2/2009 Mouli .............. 257/77

OTHER PUBLICATIONS

Choi et al., "High Injection Efficiency and Low-Voltage Programming in a Dopant-Segregated Schottky Barrier (DSSB) FinFET SONOS for NOR-type Flash Memory", IEEE Electron Device Letters, vol. 30, No. 3, Mar. 2009.

* cited by examiner

*Primary Examiner* — Samuel Gebremariam
(74) *Attorney, Agent, or Firm* — Stout, Uxa, Buyan & Mullins, LLP (57) ABSTRACT

An injection method for non-volatile memory cells with a Schottky source and drain is described. Carrier injection efficiency is controlled by an interface characteristic of silicide and silicon. A Schottky barrier is modified by controlling an overlap of a gate and a source/drain and by controlling implantation, activation and/or gate processes.

11 Claims, 7 Drawing Sheets

INJECTION METHOD WITH SCHOTTKY SOURCE/DRAIN

BACKGROUND OF THE INVENTION

1. Field of the Invention

The present invention relates generally to semiconductor fabrication methods and, more particularly, to the fabrication of non-volatile memory devices.

2. Description of Related Art

Non-volatile MOS memory cells having a source and a drain disposed in a substrate and controlled by a gate may store data by trapping charges in a dielectric region of the gate. An unprogrammed cell may have substantially no charges trapped in the dielectric. A cell may be programmed by applying suitable programming voltages to the source, drain, and gate. The programming voltages may create an electric field in a channel between the source and drain that imparts energy to charges in the channel, enabling them to reach the dielectric region. The charges may become trapped in the dielectric region, thereby changing a threshold voltage of the cell. Forward and reverse reading methods are known by which the threshold voltage may be measured in order to determine whether a cell is programmed or unprogrammed. Some memory cells may store charge in separate portions of the dielectric region, thereby effectively storing more than one bit per cell.

With scaled-down geometries, parasitic effects that may negatively affect performance of devices employing non-volatile MOS memory cells must be considered. For example, a short channel effect and punch-through issues are known to be detrimental to memory cell operation. Lower programming efficiency when channel hot electron programming is employed may also result due to a degraded lateral electric field.

A need exists in the prior art for structures and methods that provide immunity from scaling issues in non-volatile MOS memory cells.

SUMMARY OF THE INVENTION

The present invention addresses this need by providing, according to one aspect, a semiconductor non-volatile memory cell comprising a substrate, a source fabricated of silicide material in an upper surface of the substrate, a drain likewise fabricated of silicide material in an upper surface of the substrate, and a gate comprising an oxide-nitride-oxide (ONO) layer and disposed nominally between the source and the drain, the gate being fabricated at a level higher than the source and the drain, wherein a Schottky barrier is formed at an interface between the substrate and the silicide material of the source and at an interface between the substrate and the silicide material of the drain. In one embodiment of the semiconductor non-volatile memory cell the gate further comprises silicon. In another embodiment of the semiconductor non-volatile memory cell the gate comprises a silicide and the ONO layer. In yet another embodiment of the semiconductor non-volatile memory cell the gate comprises metal and the ONO layer. An embodiment of the semiconductor non-volatile memory cell has the Schottky barrier controlled by a position of the gate relative to a position of the source and to a position of the drain. In a particular embodiment of the semiconductor non-volatile memory cell, the gate is disposed above and between the source and the drain, a vertical extension of an edge of the source nearest the gate does not intersect the gate and a vertical extension of an edge of the drain nearest the gate does not intersect the gate.

While the apparatus and method has or will be described for the sake of grammatical fluidity with functional explanations, it is to be expressly understood that the claims, unless expressly formulated under 35 U.S.C. §112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. §112 are to be accorded full statutory equivalents under 35 U.S.C. §112.

Any feature or combination of features described herein are included within the scope of the present invention provided that the features included in any such combination are not mutually inconsistent as will be apparent from the context, this specification, and the knowledge of one skilled in the art. In addition, any feature or combination of features may be specifically excluded from any embodiment of the present invention. For purposes of summarizing the present invention, certain aspects, advantages and novel features of the present invention are described. Of course, it is to be understood that not necessarily all such aspects, advantages or features will be embodied in any particular implementation of the present invention. Additional advantages and aspects of the present invention are apparent in the following detailed description and claims that follow.

BRIEF DESCRIPTION OF THE FIGURES

FIGS. 7Aa-7Cd are a collection of cross-sectional diagrams of a non-volatile memory cell portraying results of the methods of FIGS. 6A-6C;

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of the disclosed structures. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a non-volatile memory device and a related method.

Figures 1A, 1B, 1C, 2A, 2B, 2C, 2D:
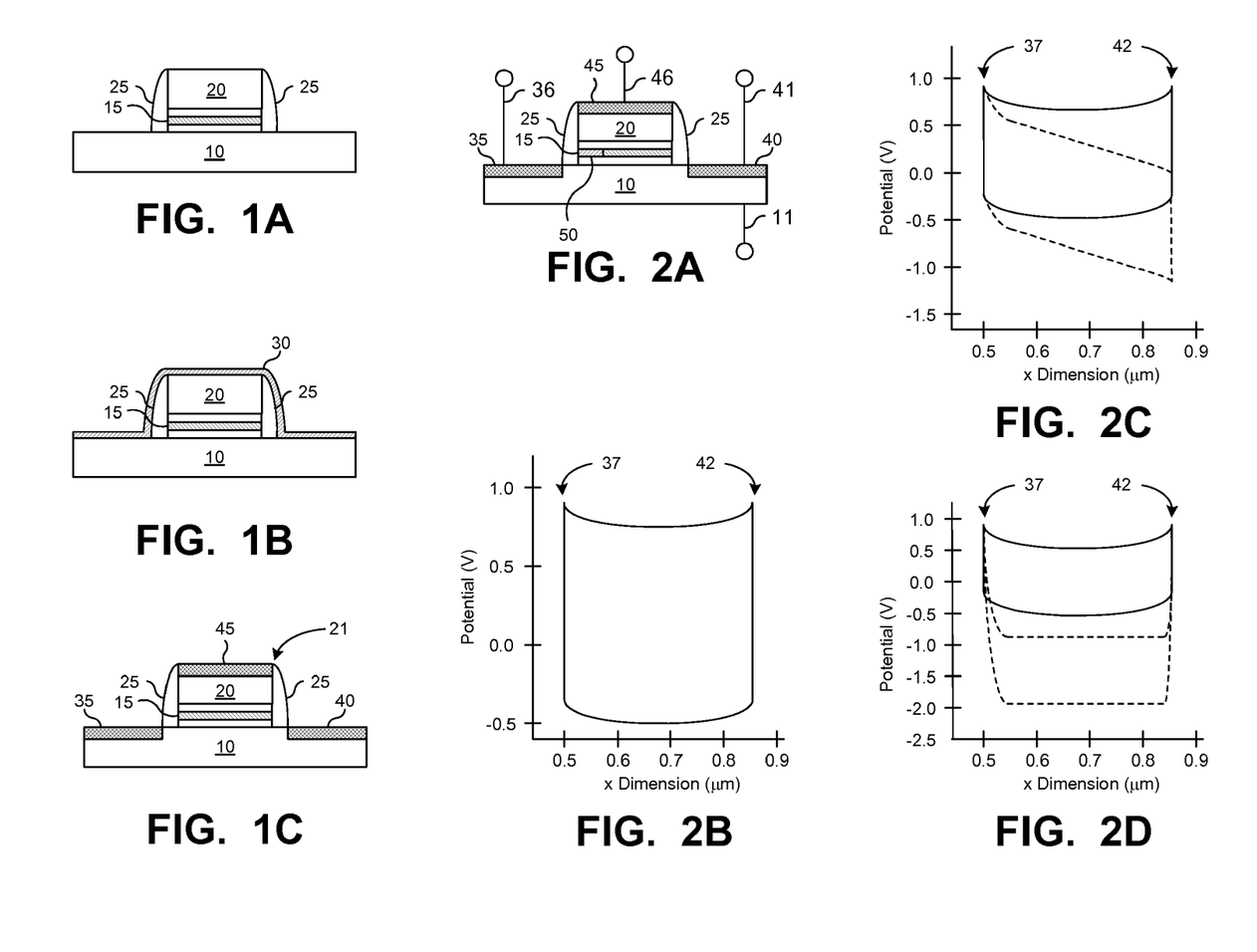
FIG. 1A is a cross-sectional diagram of a non-volatile memory cell after conventional storage layer and gate processes are performed.
FIG. 1B is a cross-sectional diagram of the non-volatile memory cell of FIG. 1A following capping with a silicide material.
FIG. 1C is a cross-sectional diagram of the non-volatile memory cell of FIG. 1B after formatting the silicide material to form a source, a drain and a gate in the memory cell.
FIG. 2A is a cross-sectional diagram of a non-volatile memory cell configured with terminals for programming.
FIG. 2B is an intrinsic energy band diagram for a non-volatile memory cell.
FIG. 2C is an energy band diagram for a non-volatile memory cell with source/drain voltages applied.
FIG. 2D is a an energy band diagram for a non-volatile memory cell with gate and source/drain voltages applied.

Referring more particularly to the drawings, FIG. 1A is a cross-sectional diagram of a partially fabricated non-volatile memory cell after conventional storage layer and gate processes are performed. Known methods may be employed to fabricate an array of such cells in a substrate 10 composed of, for example, bulk silicon or silicon-on-insulator (SOI). In some embodiments, the substrate 10 may be lightly doped with p-type atoms; in other embodiments the substrate 10 may be lightly doped with n-type atoms. A structure of a typical non-volatile memory cell fabricated using these methods may comprise a storage layer 15, which may comprise an oxide-nitride-oxide (ONO) layer. Other embodiments of the storage layer 15 may comprise, in addition to nitride, high-k dielectric material or any other kind of non-volatile charge storage material. Examples of high-k dielectric material include hafnium silicate, zirconium silicate, hafnium dioxide and zirconium dioxide. The structure, further, may comprise a gate structure 20 and insulating spacers 25. Beginning with the structure of FIG. 1A, silicide material 30 may be applied over the structure of FIG. 1A as illustrated in FIG. 1B, and a process (e.g., a thermal process) may be used to format a silicide resulting in a structure shown in FIG. 1C wherein the silicide defines a source 35, a drain 40 and a gate contact 45. The ONO layer 15, the gate structure 20 and the gate contact 45 may be referred to as a gate 21. The gate 21 is disposed nominally between the source 35 and the drain 40 and typically lies at a higher level than either the source 35 or the drain 40. In operation, bias conditions applied to the source, drain, and gate may result in conduction current coming from carriers having energy sufficient to tunnel through a Schottky barrier, which is more particularly described below. High-energy carriers from a source side of a channel that forms between the source and drain may also inject into the storage layer 15 when the bias conditions produce a suitable vertical electric field.

FIG. 2A is a cross-sectional diagram of a non-volatile memory cell similar to that illustrated in FIG. 1C and including a schematic representation of terminals that may be used to operate (e.g., program and/or read) the cell. Specifically, a source terminal 36, a drain terminal 41 and a gate terminal 46 are provided. Some embodiments also may include a substrate terminal 11. The non-volatile memory cell is illustrated with electrons 50 trapped in the storage layer 15 at a source side of the memory cell.

FIG. 2B is an intrinsic energy band diagram for a non-volatile memory cell. In an unbiased state, a Schottky barrier formed at a boundary of a semiconductor (e.g., substrate 10 in FIG. 2A) and a silicide (e.g., silicide forming the source 35 and/or the drain 40 in FIG. 2A) is controlled by the silicide material. A source 35/substrate 10 boundary (i.e., a boundary between source 35 and substrate 10; FIG. 2A) is designated as 37; a drain 40/substrate 10 boundary is designated as 42. It should be noted that the Schottky barrier is ambipolar, which admits both p- and n-type substrates. When bias voltages are applied to the source terminal 36 and the drain terminal 41, a channel may form in the substrate 10 between the source 35 and the drain 40. Under this condition, the Schottky barrier may bend as illustrated in FIG. 2C, and hot carriers in the channel with sufficient energy may tunnel through the Schottky barrier. With bias voltages applied to the gate terminal 46, the source terminal 36 and the drain terminal 41, the Schottky barrier may appear as illustrated in FIG. 2D. The gate, source, and drain terminal voltages may be positive or negative, depending upon whether positive or negative carriers are to be injected into the storage layer 50. It should be emphasized that hot carriers are injected into the storage layer 15 at the source side, not the drain side, of the non-volatile memory cell. Although various bias conditions can be introduced to modify a Schottky barrier and, thereby, to control efficiency of programming in a non-volatile memory cell, methods described herein may provide alternatives to conventional methods. The herein-described methods avoid a high-temperature activation dosage process, so that short channel effect and punch-through are substantially eliminated as problem-causing issues. Rather, these methods employ a relatively low-temperature thermal silicidation process that may provide much more elasticity of process issues than do conventional methods. Further, these methods may be relatively insensitive to device scaling.

Figure 3A:
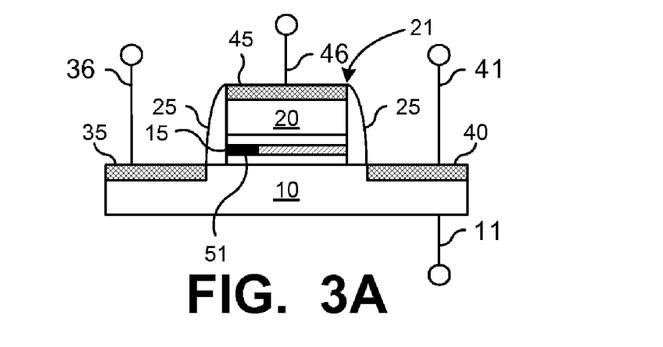
FIG. 3A is a cross-sectional diagram of a Schottky device storing a localized charge.
Figure 3B:
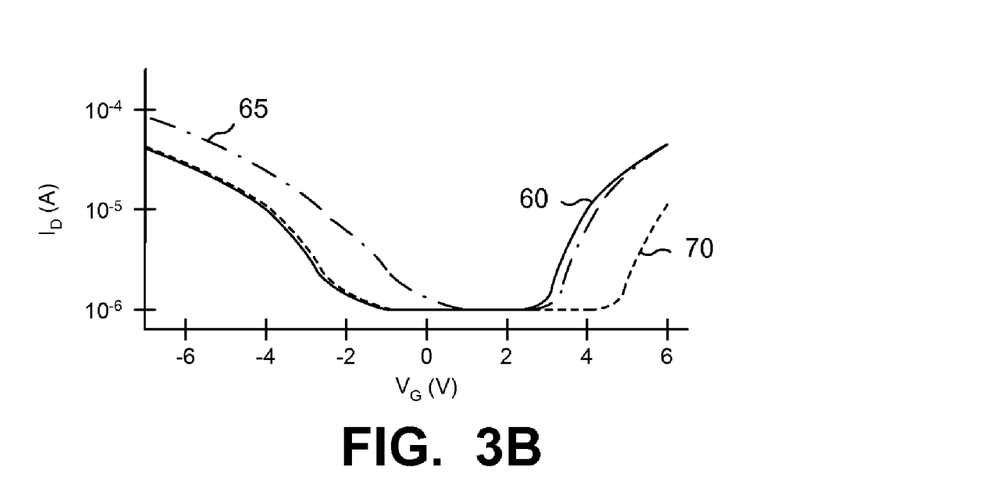
FIG. 3B is a plot of a simulated current-voltage (IV) characteristic of the Schottky device of FIG. 3A with electrons trapped near a source side under unprogrammed, forward read, and reverse read conditions.

FIG. 3A is a cross-sectional diagram of a Schottky device, i.e., non-volatile memory cell, with localized charge stored near a source side of the cell. Embodiments of devices described below may support physical 2-bit operation. That is, electrons/holes may be independently stored on a source side and a drain side of the cell. Three curves representing simulated current-voltage (IV) characteristics of the cell of FIG. 3A are shown in FIG. 3B for a case where the localized stored charge comprises electrons. A first curve 60 corresponds to an IV characteristic of an unprogrammed cell. A second curve 65 corresponds to an IV characteristic of the cell having electrons stored near the source side under forward read conditions, and a third curve 70 corresponds an IV characteristic of the cell under reverse read conditions. Methods for reading non-volatile memory cells using forward read and reverse read techniques are known to those skilled in the art.

Figure 3C:
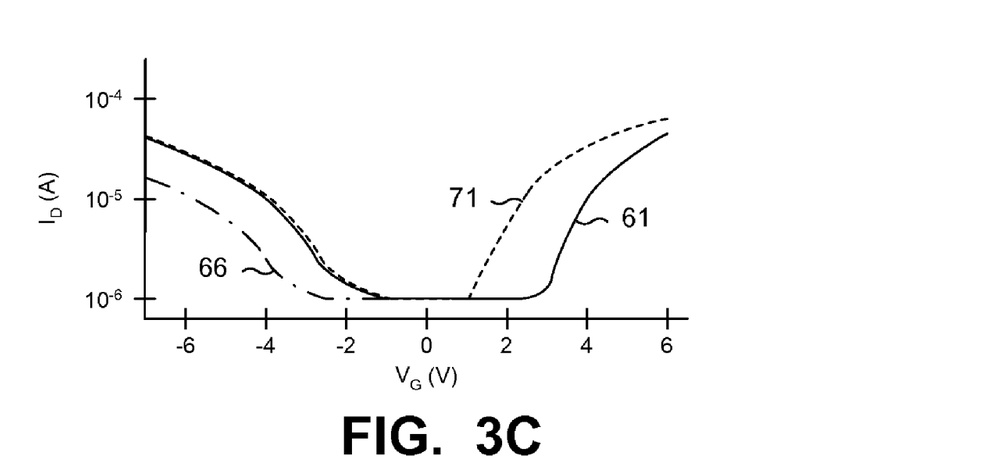
FIG. 3C is a plot of a simulated IV characteristic of the Schottky device of FIG. 3A with holes trapped near a source side under unprogrammed, forward read, and reverse read conditions.

A similar set of simulated IV characteristics of the cell of FIG. 3A is shown in FIG. 3C for a case where the localized stored charge comprises holes. As before, a first curve 61 corresponds to an IV characteristic of an unprogrammed cell, and a second curve 66 corresponds an IV characteristic of the cell having holes stored near the source side under forward read conditions. A third curve 71 corresponds an IV characteristic of the cell under reverse read conditions.

Figure 4A:
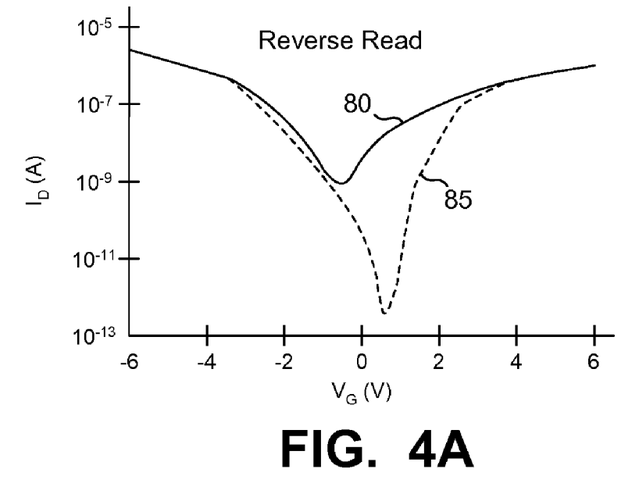
FIG. 4A is a plot of an experimental IV characteristic of the Schottky device of FIG. 3A under reverse read conditions.
Figure 4B:
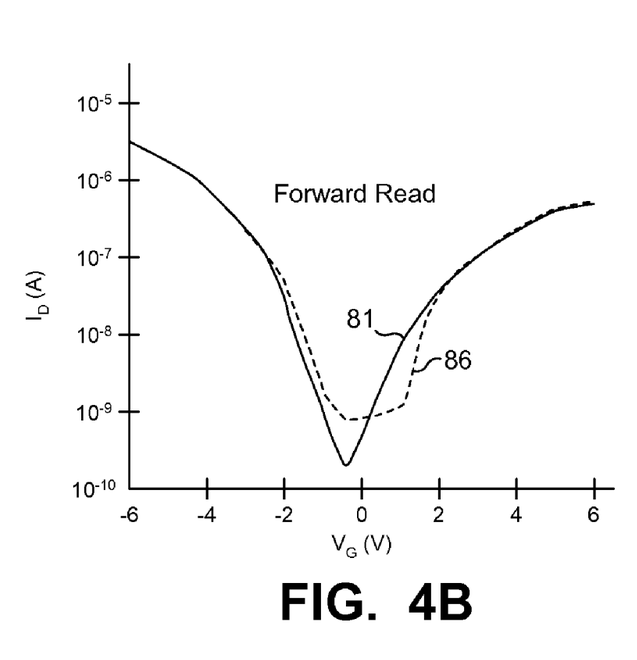
FIG. 4B is a plot of an experimental IV characteristic of the Schottky device of FIG. 3A under forward read conditions.

Experimental results corresponding to FIG. 3B are shown in FIGS. 4A and 4B. FIG. 4A presents a first curve 80 corresponding to an IV characteristic of an unprogrammed cell under reverse read conditions. A second curve 85 in FIG. 4A corresponds to an IV characteristic of a non-volatile memory cell having electrons trapped near a source side. Forward read results are presented in FIG. 4B wherein a first curve 81 corresponds to an IV characteristic of an unprogrammed cell, and a second curve 86 corresponds to an IV characteristic of a cell having electrons trapped near the source side under forward read conditions. Approximate program bias voltages for the characteristics presented in FIGS. 4A and 4B include a gate voltage ranging from about zero to about 10 volts, a source voltage ranging from about −5 to about 5 volts a substrate voltage ranging from about −3 to about 3 volts, and drain voltage ranging from about −3 to about 3 volts. Generally, the drain potential may be higher than the source potential, and gate potential may be higher than the drain voltage. The experimental results of FIGS. 4A and 4B may be noted to be consistent with the simulated results of FIG. 3B. It should be emphasized that electrons are injected into the storage layer 15 at the source side, not the drain side, of the non-volatile memory cell.

Carrier injection efficiency and/or program efficiency is controlled by the Schottky barrier at interfaces of silicide/silicon. Modifying the Schottky barrier at the source side may improve program efficiency. The methods described herein may be combined with other techniques, including extra well dosage implantation, junction implantation, pocket implantation and gate implantation. Methods will now be described for modifying characteristics of the Schottky barrier.

Figure 5A:
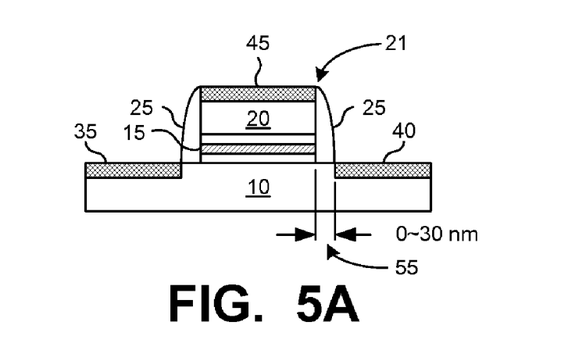
FIG. 5A is a cross-sectional diagram of a non-volatile memory cell showing a Schottky barrier modified with non-overlapping source/drain and gate structures.
Figure 5B:
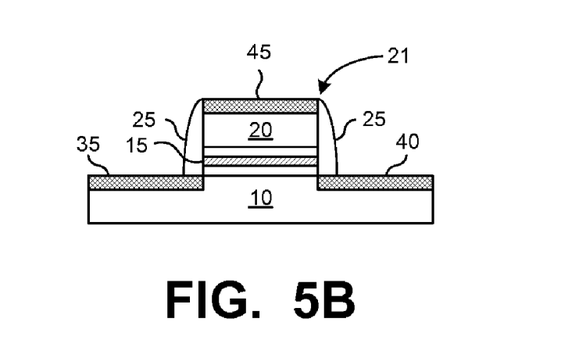
FIG. 5B is a cross-sectional diagram of a non-volatile memory cell showing a Schottky barrier modified with source/drain edges substantially aligned with gate edges.
Figure 5C:
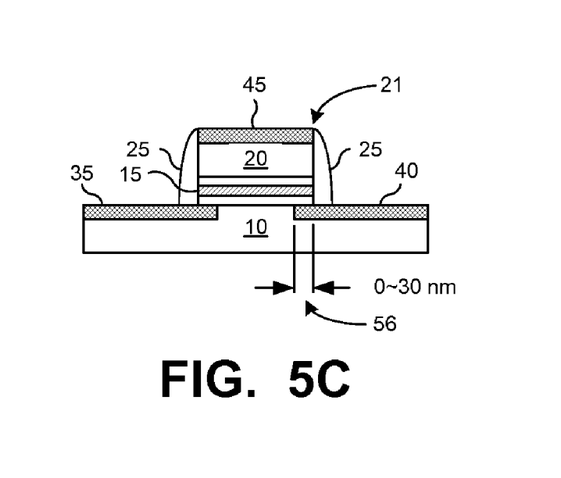
FIG. 5C is a cross-sectional diagram of a non-volatile memory cell showing a Schottky barrier modified with overlapping source/drain edges and gate edges.

One method of modifying the Schottky barrier, as exemplified in FIGS. 5A-5C, comprises controlling an overlap between the source/drain and the gate of a non-volatile memory cell. FIG. 5A is a cross-sectional diagram of a non-volatile memory cell of a type already introduced comprising a source 35, a drain 40, and a gate 21 with the source 35, the drain 40 and a gate contact 45 formed of silicide. The cell is fabricated with a gap 55 between a vertical extension of the drain 40 and an edge of the gate 21 nearest the drain 40. A similar gap may exist between a vertical extension of the source 35 and an edge of the gate 21 nearest the gate 35. In the illustrated example, carriers must tunnel through a relatively large barrier in order to reach the storage layer 15, whereby best programming efficiency in the illustrated embodiment may be found by modifying the tunneling barrier. Tunneling behavior depends upon characteristics of materials and is relatively insensitive to device scaling. In FIG. 5B, a similar memory cell structure is illustrated, but with the Schottky junction (i.e., a source/substrate interface and/or a drain/substrate interface) being substantially aligned with an edge of the gate 21. In this case, a characteristic of the Schottky barrier may be controlled by characteristics of interfaces between silicide and silicon. According to yet another example, FIG. 5C illustrates a memory cell structure fabricated with an overlap 56 between the Schottky junction and the gate 21. That is, a vertical extension of an edge of the drain 40 overlaps an edge of the gate 21 nearest the drain 40. Again, a similar gap may exist between a vertical extension of an edge of the source 35 and an edge of the gate 21 nearest the source 35. Working from this configuration, modifying bias conditions may improve programming efficiency.

Figure 6A:
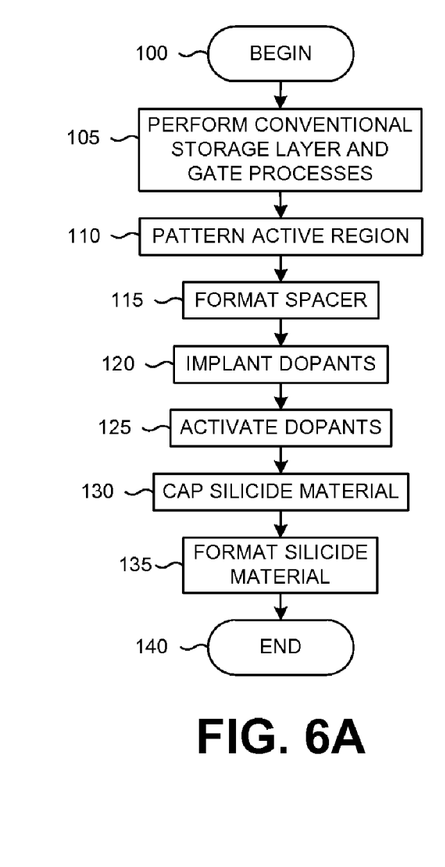
FIGS. 6A-6C are a collection of three flow diagrams depicting alternative methods of modifying a Schottky barrier.

Additional methods of modifying a Schottky barrier are diagrammed in FIGS. 6A-6C and described with reference to FIG. 7Aa-7Cd. The flow diagram of FIG. 6A presents an implementation of one method of fabricating a memory cell employing a Schottky barrier. According to the illustrated implementation, which begins at step 100, conventional storage layer and gate processes may be performed at step 105 in a manner well understood by those skilled in the art. An active region may be patterned at step 110 and a spacer may be formatted at step 115 using known methods. An example of a result of following steps 100, 105 and 110 is illustrated in FIG. 1A. An implantation may be performed at step 120 whereby atoms of a doping material are implanted in the structure resulting from (e.g., following) completion of step 115. FIG. 7Aa illustrates one implementation of step 120 wherein an implant dosage 28 is directed at the structure following step 115. Dopants implanted at step 120 may be activated by employing, for example, a relatively low-temperature thermal process. A silicide material 30 may be deposited (e.g., capped) on the structure of FIG. 7Ab at step 130, followed by performance of a thermal process at step 135 to format the silicide material 30 and create a silicide that defines a source 35, a drain 40, and a gate contact 45. A Schottky barrier 43 modified by the doping may form as a result, characteristics of which may be controlled by controlling (e.g., adjusting characteristics of) the steps of the implementation of FIG. 6A. The implementation then or later (e.g., ultimately) can be terminated at step 140.

Figure 6B:
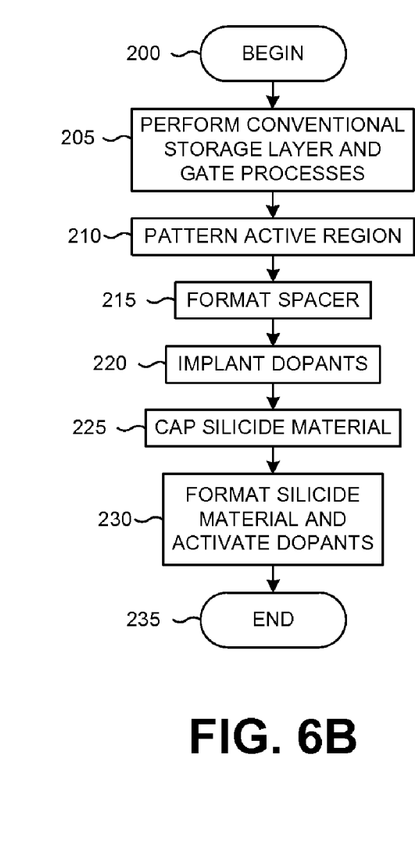
Figure 7:
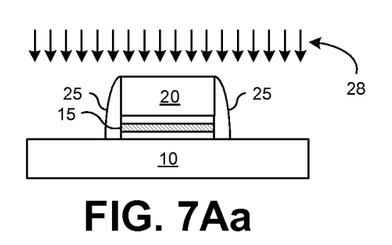

An implementation of another method of fabricating a memory cell having a modified Schottky barrier is described in the flow diagram of FIG. 6B. Steps 200-220 of the implementation of FIG. 6B may be identical to corresponding steps 100-120 of FIG. 6A. However, the implementation of FIG. 6B deposits silicide material 30 (FIG. 7Bb) at step 225 without a step of activating dopants implanted at step 220. The process can be discerned from the schematics of FIGS. 7Ba and 7Bb. A thermal process performed at step 230 then may both format a silicide and activate the dopants, thereby creating a Schottky barrier 43 modified by the doping as shown in FIG. 7Bc. The implementation of the method of FIG. 6B can be terminated at step 235.

Figure 6C:
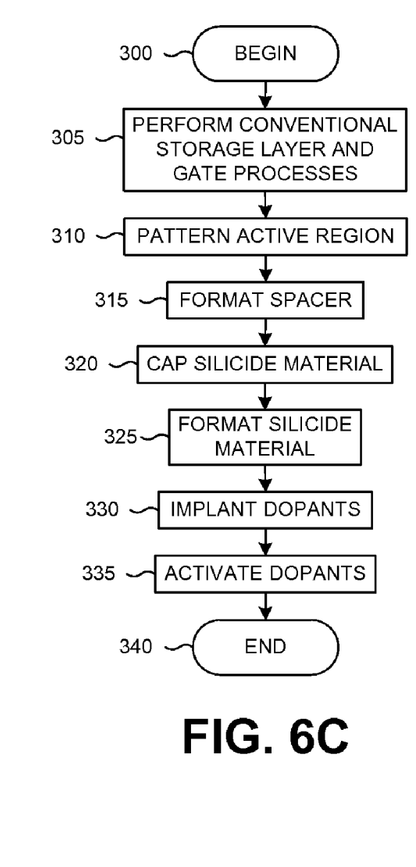

A further implementation of yet another method of fabricating a memory cell that includes a modified Schottky barrier is depicted in the flow diagram of FIG. 6C. Again, steps 300-315 in FIG. 6C may be identical to corresponding steps 100-115 of FIG. 6A. At step 320, a silicide material 30 is deposited over the structure formed after step 325 as illustrated in FIG. 7Ca. The silicide material 30 may be formatted at step 325 using a thermal process thereby forming a source, a drain and a gate contact as shown in FIG. 7Cb. An implantation step may then be performed at step 330 as described in FIG. 7Cc wherein an implant dosage 28 of doping material is applied to the structure of FIG. 7Cb. The implantation may be activated at step 335 as shown in FIG. 7Cd to form a Schottky barrier 43 modified by doping. The implementation of the method can be terminated at step 340.

Figure 8:
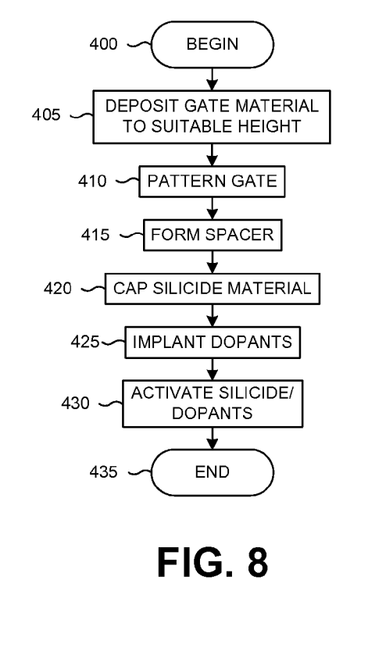
FIG. 8 is a flow diagram summarizing an implementation of another alternative method of modifying a Schottky barrier.
Figure 9A:
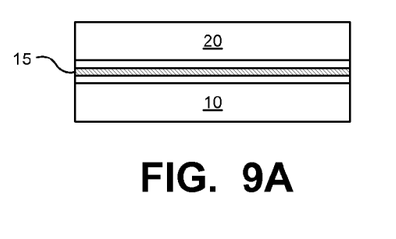
FIGS. 9A-9F are a collection of cross-sectional diagrams of a non-volatile memory cell elucidating results of the implementation of FIG. 8.
Figure 9B:
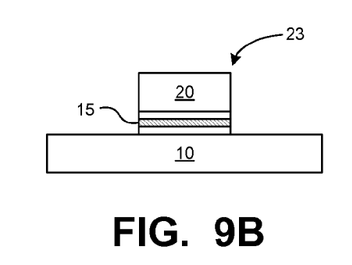
Figure 9C:
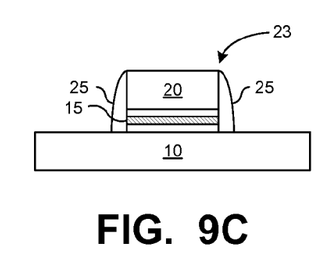
Figure 9D:
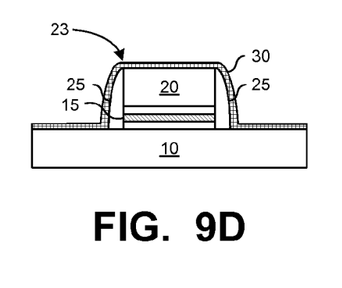
Figure 9E:
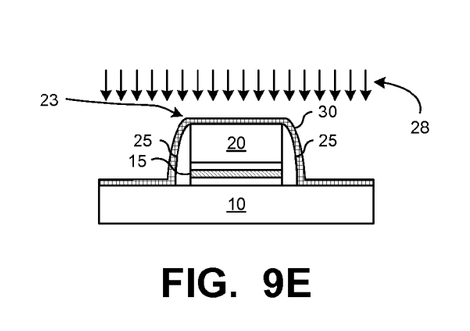
Figure 9F:
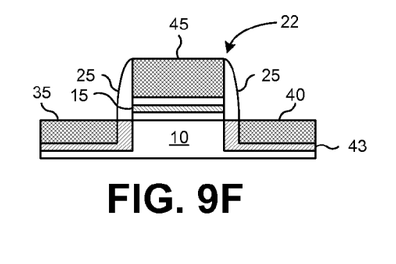

FIG. 8 illustrates yet another implementation of a method of fabricating a memory cell with a modified Schottky barrier comprising a gate process. The process described in the flow diagram of FIG. 8, which may be integrated with any of the processes described above in connection with FIGS. 6A-6C, may act to adjust a gate workfunction. With reference to FIGS. 9A-9F, this implementation begins at step 400 and continues by depositing gate material 20 (FIG. 9A) onto a charge trapping layer 15 that overlies a substrate 10, which may be formed of, for example, lightly doped or intrinsic silicon. The gate material 20 may comprise silicon. A gate structure 23 may be patterned at step 410 using known methods as shown in FIG. 9B, and a spacer 25 may be formed on sides of the gate structure 23 at step 415, again using known methods to form the structure depicted in FIG. 9C. Silicide material 30 may be deposited on the result of step 415 as shown in FIG. 9D, and an implantation 28 of doping atoms may be introduced at step 425 (cf. FIG. 9E). An activation process, which may be a low-temperature thermal process, may be performed at step 430 to activate the dopants and create a silicide that forms a gate contact 45, a source 35, and a drain 40 as shown in FIG. 9F. By extending a time duration of the activation process, substantially all of the gate material 20 may be silicided, resulting in a fully silicided (FUSI) gate 22. A Schottky barrier 43 modified by doping may form between the source 35/drain 40 and the substrate 10. As a variation on the method of FIG. 8, a metal gate may be formed to replace the FUSI gate.

Summarizing the FIGS. 6A, 6B, 6C and 8 Schottky-barrier modification methods, FIG. 6A describes an implantation and dosage activation followed by a silicidation process; FIG. 6B describes an implantation (and capping with silicide material) followed by simultaneous performance of the dosage activation and silicidation; FIG. 6C describes silicidation followed by dosage implantation and activation processes; and FIG. 8 describes formation of a fully silicided gate to create a memory cell having a modified Schottky barrier. These techniques, which may operate to provide significant immunity to problems arising from memory device miniaturization, support physical and electrical 1-bit and 2-bit operation, and the resultant memory cells are easily implemented in or as NOR/NAND type flash memories. Further, these methods may apply to operation of any type of non-volatile memories including, for example, floating gate and split gate structures.

In view of the foregoing, it will be understood by those skilled in the art that the methods of the present invention can facilitate formation and operation of non-volatile memory devices in an integrated circuit. In particular, the non-volatile memory devices may comprise dual bit cell structures. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A semiconductor non-volatile memory cell, comprising:
a substrate;
a source fabricated of silicide material in an upper surface of the substrate;
a drain fabricated of silicide material in an upper surface of the substrate; and
a gate structure comprising a charge storage layer disposed nominally between the source and the drain;
wherein a Schottky barrier is formed at an interface between the substrate and the silicide material of the source and at an interface between the substrate and the silicide material of the drain.

2. The semiconductor non-volatile memory cell as set forth in claim 1, wherein the charge storage layer comprises an oxide-nitride-oxide (ONO) layer.

3. The semiconductor non-volatile memory cell as set forth in claim 1, wherein the charge storage layer comprises high-k dielectric material.

4. The semiconductor non-volatile memory cell as set forth in claim 1, wherein the gate further comprises silicon.

5. The semiconductor non-volatile memory cell as set forth in claim 1, wherein the gate comprises a silicide.

6. The semiconductor non-volatile memory cell as set forth in claim 1, wherein the gate comprises metal.

7. The semiconductor non-volatile memory cell as set forth in claim 1, wherein:
a vertical extension of an edge of the source nearest the gate does not intersect the gate; and
a vertical extension of an edge of the drain nearest the gate does not intersect the gate.

8. The semiconductor non-volatile memory cell as set forth in claim 1, wherein:
a vertical extension of an edge of the source nearest the gate substantially coincides with an edge of the gate; and
a vertical extension of an edge of the drain nearest the gate substantially coincides with an edge of the gate.

9. The semiconductor non-volatile memory cell as set forth in claim 1, wherein:
an edge of the gate overlaps a vertical extension of an edge of the source; and
an edge of the gate overlaps a vertical extension of an edge of the drain.

10. The semiconductor non-volatile memory cell as set forth in claim 1, wherein the memory cell is configured for physical 1-bit operation.

11. The semiconductor non-volatile memory cell as set forth in claim 1, wherein the memory cell is configured for physical 2-bit operation.

* * * * *